US010210928B2

(12) United States Patent
Tiburzi et al.

(10) Patent No.: US 10,210,928 B2
(45) Date of Patent: *Feb. 19, 2019

(54) APPARATUSES INCLUDING CURRENT COMPLIANCE CIRCUITS AND METHODS

(71) Applicant: Micron Technology, Inc., Boise, ID (US)

(72) Inventors: Marco-Domenico Tiburzi, Avezzano (IT); Giulio-Giuseppe Marotta, Contigliano (IT)

(73) Assignee: Micron Technology, Inc., Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 14/510,950

(22) Filed: Oct. 9, 2014

(65) Prior Publication Data
US 2015/0023095 A1    Jan. 22, 2015

Related U.S. Application Data

(63) Continuation of application No. 13/471,568, filed on May 15, 2012, now Pat. No. 8,861,255.

(51) Int. Cl.
*G11C 13/00* (2006.01)
*G11C 5/14* (2006.01)
*G11C 7/20* (2006.01)

(52) U.S. Cl.
CPC ............ *G11C 13/003* (2013.01); *G11C 5/147* (2013.01); *G11C 7/20* (2013.01); *G11C 13/0002* (2013.01);
(Continued)

(58) Field of Classification Search
CPC ......... G11C 13/003; G11C 5/147; G11C 7/20; G11C 13/0002
(Continued)

(56) References Cited

U.S. PATENT DOCUMENTS 6,424,571 B1 * 7/2002 Pekny ............... G11C 16/24
327/51
8,861,255 B2 * 10/2014 Tiburzi et al. ............... 365/148
(Continued)

FOREIGN PATENT DOCUMENTS

CN    101286364 A    10/2008
CN    101465157 A    6/2009
(Continued)

OTHER PUBLICATIONS

"International Application Serial No. PCT/US2013/040959, International Search Report dated Sep. 6, 2013", 3 pgs.
(Continued)

*Primary Examiner* — Anthan Tran
(74) *Attorney, Agent, or Firm* — Schwegman Lundberg & Woessner, P.A.

(57) ABSTRACT

Apparatus, devices, systems, and methods are described that include variable state material data storage. Example devices include current compliance circuits that are configured to dynamically adjust a current passing through a variable resistance material during a memory operation. Some configurations utilize components within an array of memory cells to form a current compliance circuit. Additional apparatus, systems, and methods are described.

18 Claims, 7 Drawing Sheets

(52) U.S. Cl.
CPC ...... *G11C 13/0004* (2013.01); *G11C 13/0028* (2013.01); *G11C 13/0069* (2013.01); *G11C 13/0097* (2013.01); *G11C 2013/0071* (2013.01); *G11C 2013/0078* (2013.01); *G11C 2013/0083* (2013.01); *G11C 2211/5645* (2013.01); *G11C 2213/79* (2013.01)

(58) Field of Classification Search
USPC ........................................................ 365/148
See application file for complete search history.

(56) References Cited

U.S. PATENT DOCUMENTS

| | | | |
|---|---|---|---|
| 2001/0046174 | A1 | 11/2001 | Kin et al. |
| 2002/0027806 | A1 | 3/2002 | Quader et al. |
| 2004/0124823 | A1 | 7/2004 | Fulton et al. |
| 2005/0128799 | A1 | 6/2005 | Kurotsuchi et al. |
| 2007/0195580 | A1* | 8/2007 | Hoenigschmid et al. .... 365/148 |
| 2007/0230239 | A1 | 10/2007 | Choi et al. |
| 2008/0094913 | A1* | 4/2008 | Fasoli .................... G11C 16/12 365/185.23 |
| 2008/0123392 | A1 | 5/2008 | Kinoshita |
| 2008/0123393 | A1 | 5/2008 | Kinoshita |
| 2010/0054017 | A1* | 3/2010 | Maejima ....................... 365/148 |
| 2010/0124125 | A1* | 5/2010 | Amanai et al. .......... 365/185.21 |
| 2010/0214818 | A1* | 8/2010 | Kitagawa et al. ............ 365/148 |
| 2010/0327844 | A1 | 12/2010 | Ranjan |
| 2011/0051506 | A1* | 3/2011 | Thorp ................ G11C 13/0004 365/163 |
| 2011/0096590 | A1 | 4/2011 | Iwata |
| 2011/0122679 | A1 | 5/2011 | Chen et al. |
| 2011/0205782 | A1 | 8/2011 | Costa et al. |
| 2013/0308376 | A1 | 11/2013 | Tiburzi et al. |

FOREIGN PATENT DOCUMENTS

| | | |
|---|---|---|
| CN | ZL201380029237.6 | 11/2017 |
| KR | 102010013237 A | 12/2010 |
| TW | 201401282 A | 1/2014 |
| WO | WO-2012058324 A2 | 5/2012 |
| WO | WO-2013173343 A1 | 11/2013 |

OTHER PUBLICATIONS

"International Application Serial No. PCT/US2013/040959, Written Opinion dated Sep. 6, 2013", 7 pgs.
"Chinese Application Serial No. 201380029237.6, Examiner Interview Summary dated Jun. 19, 2017", w/English Translation, 5 pgs.
"Chinese Application Serial No. 201380029237.6, Office Action dated Mar. 15, 2017", w/English Translation, 14 pgs.
"Chinese Application Serial No. 201380029237.6, Office Action dated Aug. 1, 2016", w/English Translation, 21 pgs.
"Chinese Application Serial No. 201380029237.6, Response filed May 25, 2017 to Office Action dated Mar. 15, 2017", w/English Claims, 24 pgs.
"Chinese Application Serial No. 201380029237.6, Response filed Dec. 14, 2016 to Office Action dated Aug. 1, 2016", W/ English Translation of Claims, 17 pgs.
"International Application Serial No. PCT/US2013/040959, International Preliminary Report on Patentability dated Nov. 27, 2014", 9 pgs.
"Taiwanese Application Serial No. 1021117251, Response filed Jun. 29, 2017 to Office Action dated Dec. 27, 2016", w/English Claims, 23 pgs.
"Taiwanese Application Serial No. 102117251, Decision of Rejection dated Aug. 28, 2017", w/English Translation, 12 pgs.
"Taiwanese Application Serial No. 102117251, Office Action dated Jul. 4, 2016", w/English Translation, 12 pgs.
"Taiwanese Application Serial No. 102117251, Office Action dated Dec. 27, 2016", (English Translation), 7 pgs.
"Taiwanese Application Serial No. 102117251, Response filed Mar. 1, 2018 to Decision of Rejection dated Aug. 28, 2017", w/English Claims, 22 pgs.
"Taiwanese Application Serial No. 102117251, Response filed Dec. 7, 2016 to Office Action dated Jul. 4, 2016", w/English Claims, 9 pgs.
"Korean Application Serial No. 10-2014-7035065, Notice of Preliminary Rejection dated Jun. 28, 2018", w/ English translation, 18 pgs.
"Korean Application Serial No. 10-2014-7035065, Response filed Aug. 28, 2018 to Notice of Preliminary Rejection dated Jun. 28, 2018", w/ English Claims, 25 pgs.

* cited by examiner

APPARATUSES INCLUDING CURRENT COMPLIANCE CIRCUITS AND METHODS

PRIORITY APPLICATION

This application is a continuation of U.S. application Ser. No. 13/471,568, filed May 15, 2012, which is incorporated herein by reference in its entirety.

BACKGROUND

Some semiconductor devices include variable state materials. For example, memory cells such as resistive random access memory (RRAM) cells include a variable state material whose state can be changed from a high resistance state to a low resistance state, and back again. Variable state materials are often non-volatile and can be formed in memory cells having a small form factor. However, in some configurations, variable state materials can exhibit longer program times than other storage technologies, such as flash memory.

DETAILED DESCRIPTION

In the following detailed description of various embodiments of the invention, reference is made to the accompanying drawings that form a part hereof and in which are shown, by way of illustration, specific embodiments in which the invention may be practiced. These embodiments are described in sufficient detail to enable those of ordinary skill in the art to practice the invention. Other embodiments may be utilized and structural, logical, and electrical changes may be made.

Figure 1:
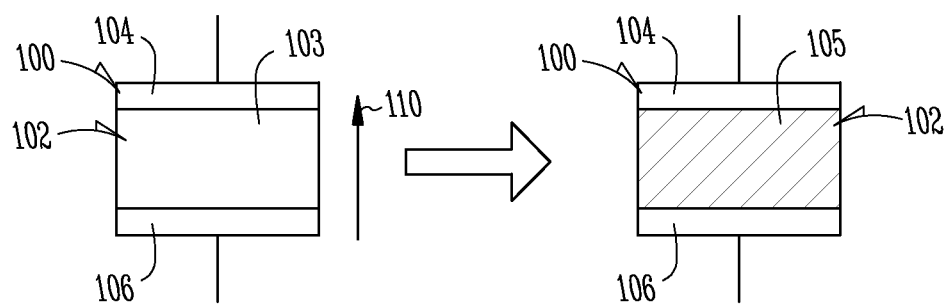
FIG. 1 shows a block diagram setting a first state of a memory cell component according to an embodiment of the invention.

FIG. 1 shows an example component 100 of a memory cell according to an embodiment of the invention. A variable state material 102 is shown located between a first electrode 104 and a second electrode 106. In one example, the variable state material 102 comprises a resistance switching material. Other examples of variable state materials 102 include magnetic switching materials, or other switching materials having a detectable electronic state.

In one example, when a voltage is applied in a first direction 110 across the variable state material 102, the state of the variable state material 102 is changed from a high resistance state 103 to a low resistance state 105. In an array of memory cells including a component such as component 100, the high resistance state may represent a digital bit of data, such as a logic 1 or a logic 0 value. Selection circuitry, such as row and column decoders, may be used to select a desired memory cell (including a variable state material 102) from an array of cells, to query and/or alter the resistance state, thus providing data recall and storage capability.

A number of mechanisms can be used to change the physical state (and therefore, the resistance) of the variable state material 102. In one example, the variable state material 102 is changed from a substantially amorphous state to a substantially crystalline state. In another example, upon application of the voltage, one or more conductive filaments are formed within the variable state material 102 that bridge the distance between the first electrode 104 and the second electrode 106. In various mechanisms, the state change is reversible.

Figure 2:
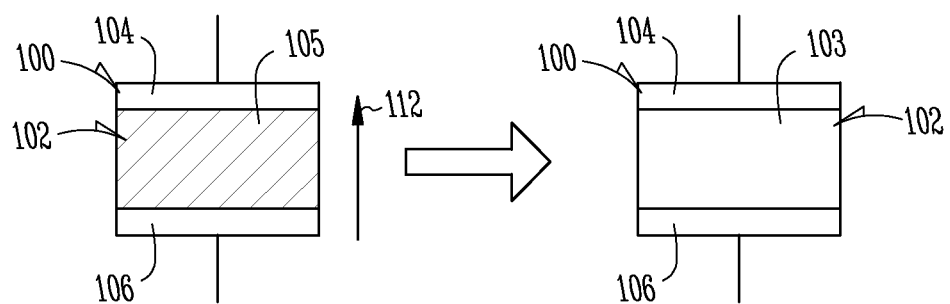
FIG. 2 shows a block diagram setting a second state of the memory cell component from FIG. 1, according to an embodiment of the invention.

FIG. 2 shows the example component 100 from FIG. 1, in the low resistance state 105. By application of a second voltage in a direction 112 that is opposite the first direction shown in FIG. 1, the variable state material 102 is reversed from the low resistance state 105 back to the high resistance state 103. In this way, the physical state (and thus the resistance) of the variable state material 102 can be changed as desired to occupy a selected one of at least two possible states.

Figure 3:
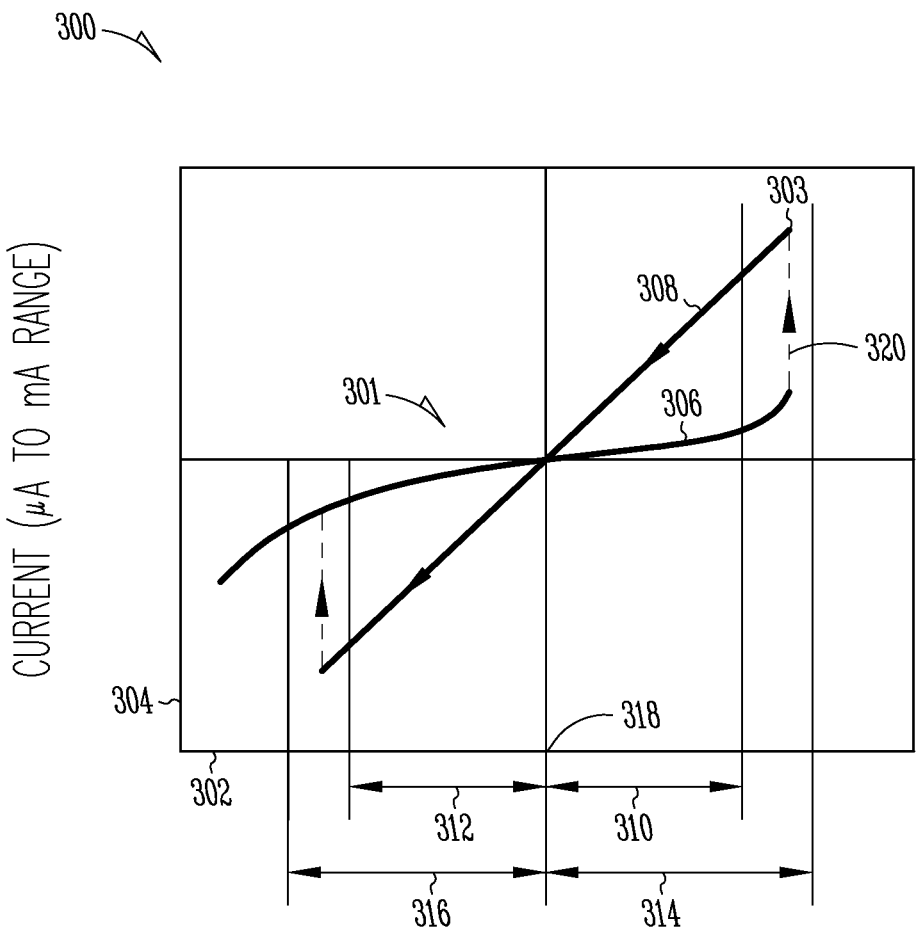
FIG. 3 shows a voltage-current diagram of a variable resistive material according to an embodiment of the invention.

FIG. 3 shows an example voltage/current diagram 300 of a variable state material. The diagram shows voltage on the X-axis 302 and current on the Y-axis 304. In operation, a variable state material exhibits high resistance behavior along a high resistance portion 306 of the illustrated curve 301. If an applied voltage is within a first voltage range 310, or a second voltage range 312 with respect to a reference voltage level 318, the variable state material remains within the high resistance portion 306 of the curve 301. In one example, the first voltage range 310 is approximately 0.5 volts. In one example, the first voltage range and the second voltage range are substantially symmetric in magnitude, and the second voltage range 312 is approximately −0.5 volts.

If an applied voltage is greater than or equal to a third voltage range 314 (which is in turn greater than the upper limit of the voltage range 310) with respect to the reference voltage level 318, the variable state material exhibits low resistance, as illustrated by point 303 on the curve 301 and moves to a low resistance portion 308 of the curve 301. The variable state material will remain in the low resistance portion 308 of the curve 301 until an applied voltage magnitude is greater than or equal to a magnitude of a fourth voltage range 316 (which is in turn greater than the magnitude of the voltage range 312) with respect to the reference voltage level 318. Then the variable state material will again return to the high resistance portion 306 of the curve 301.

Although FIG. 3 illustrates a variable state material resistance changing property. In one example, the reference voltage 318 is approximately zero volts, with the third voltage range 314 and fourth voltage range 316 being substantially equal in magnitude, and opposite in polarity. For example the third voltage range 314 may be approximately 1 volt, and the fourth voltage range 316 may be approximately −1 volt.

In another example, the reference voltage 318 may be approximately 3 volts, with the third voltage 314 and fourth voltage 316 being substantially equal, as defined by a voltage offset. For example the third voltage 314 may be approximately 4 volts (reference voltage 318 plus a voltage offset of about 1 volt), and the fourth voltage 316 may be approximately 2 volts (reference voltage 318 minus a voltage offset of about 1 volt).

Variable state materials may be formed into relatively small, non-volatile memory cells. In one example, a one transistor, one resistor (1T1R) configuration is possible, in contrast to transistor-based static random access memory (SRAM) cells that use six transistors.

In operation, when moving from the high resistance portion 306 of the curve 301 to point 303 on the low resistance portion 308 of the curve 301, an applied current rapidly increases as programming completes, as shown by portion 320 of the curve 301. This behavior presents a technical challenge in a memory cell set operation, where a memory cell transitions from a high resistance state to a low resistance state. If the set current is not controlled, high current in a variable state material component of a memory cell may cause joule heating, and damage the memory cell. Example configurations to control current in variable state material memory cells are described in more detail below.

Figure 4:
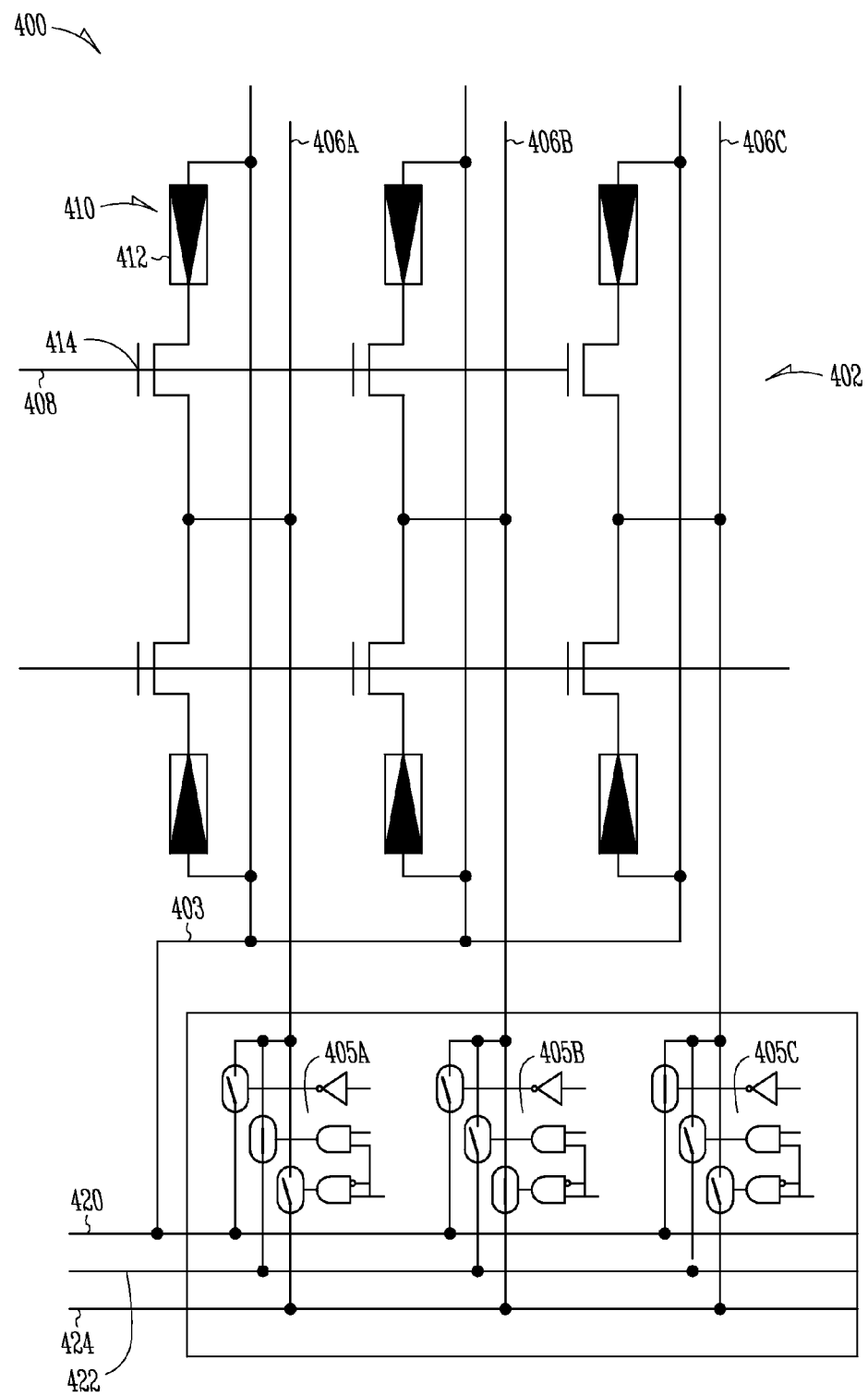
FIG. 4 shows a circuit diagram of a memory device according to an embodiment of the invention.

FIG. 4 shows an example circuit diagram of an apparatus 400 including a variable state material according to an embodiment of the invention. In one example, the apparatus 400 comprises a memory device. In the example of FIG. 4, the apparatus 400 includes an array 402 of memory cells 410, and a driver circuit 404. In one example, the driver circuit 404 is configured to provide different voltages to different memory cells 410 in the array 402 at the same time.

At least some of the cells 410 in the array 402 include a variable state material component 412. In one example, the variable state material component 412 includes a variable state material coupled between a first electrode and a second electrode, similar to or identical to the examples described in FIGS. 1 and 2. Memory cells 410 in the array 402 further include an access device 414. In one example, the access device 414 includes an n-type metal oxide (NMOS) transistor. Other examples of access devices 414 may include additional circuitry, diodes, and other electronic devices.

FIG. 4 further shows a number of access lines 408 coupled to access devices 414 in the array 402. A source 403, and a number of data lines 406a-406c are shown coupled to the memory cells 410 in the array 402. In one example, the number of data lines includes a number of bit lines. In the example of FIG. 4, the driver circuit 404 is configured as a column driver.

In one example, the driver circuit 404 is configured to provide multiple different voltages to data lines 406a-406c coupled to different memory cells at the same time. The driver circuit 404 is shown including a first voltage input line 420, a second voltage input line 422, and a third voltage input line 424. Although three different voltage input lines are shown, other configurations including two voltage input lines, or more than three voltage input lines are within the scope of various embodiments.

A number of selector circuits 405a-405c are included in the driver circuit 404 to select one of the voltage input lines 420, 422, 424 and apply a selected voltage to one or more selected memory cells 410 in the array 402. In the example shown, the selector circuits 405a-405c are individually selectable to apply different voltages to different memory cells 410 in the array 402. For example, a first selector circuit 405a is shown selecting the second voltage input line 422 to apply a voltage to data line 406a. The second selector circuit 405b is shown selecting the third voltage input line 424 to apply a voltage to data line 406b. The third selector circuit 405c is shown selecting the first voltage input line 420 to apply a voltage to data line 406c.

In one example the voltage input lines 420, 422, 424 are configured to apply a set voltage, a reset voltage, and an inhibit voltage. Using FIG. 3 as an example, the reference voltage 318 comprises an inhibit voltage. Memory cells 410 in the array 402 that receive the inhibit voltage will not be programmed to a high resistance state, or reversed from a high resistance state to a low resistance state.

A set voltage may include an inhibit voltage plus an offset voltage, such as the third voltage 314. A reset voltage may include an inhibit voltage minus an offset voltage, such as the fourth voltage 316.

In operation, each of the selector circuits 405a-405c are individually selectable, and can provide any available voltage from the voltage input lines 420, 422, 424 to any desired data line 406a-406c at the same time. Performance of the apparatus 400 may be enhanced using the driver circuit 404 shown in FIG. 4. For example, at the same time selected cells in a given column of the array 402 are being set to a low resistance state, other selected cells in a different given column of the array 402 can be reset. Additionally, at the same time, other cells in the array 402 may have no operation performed on them as a result of an applied inhibit voltage. Data programming operation times may be reduced by a factor of more than two times when compared to devices that are only capable of driving one voltage to the array at a time.

Figure 5:
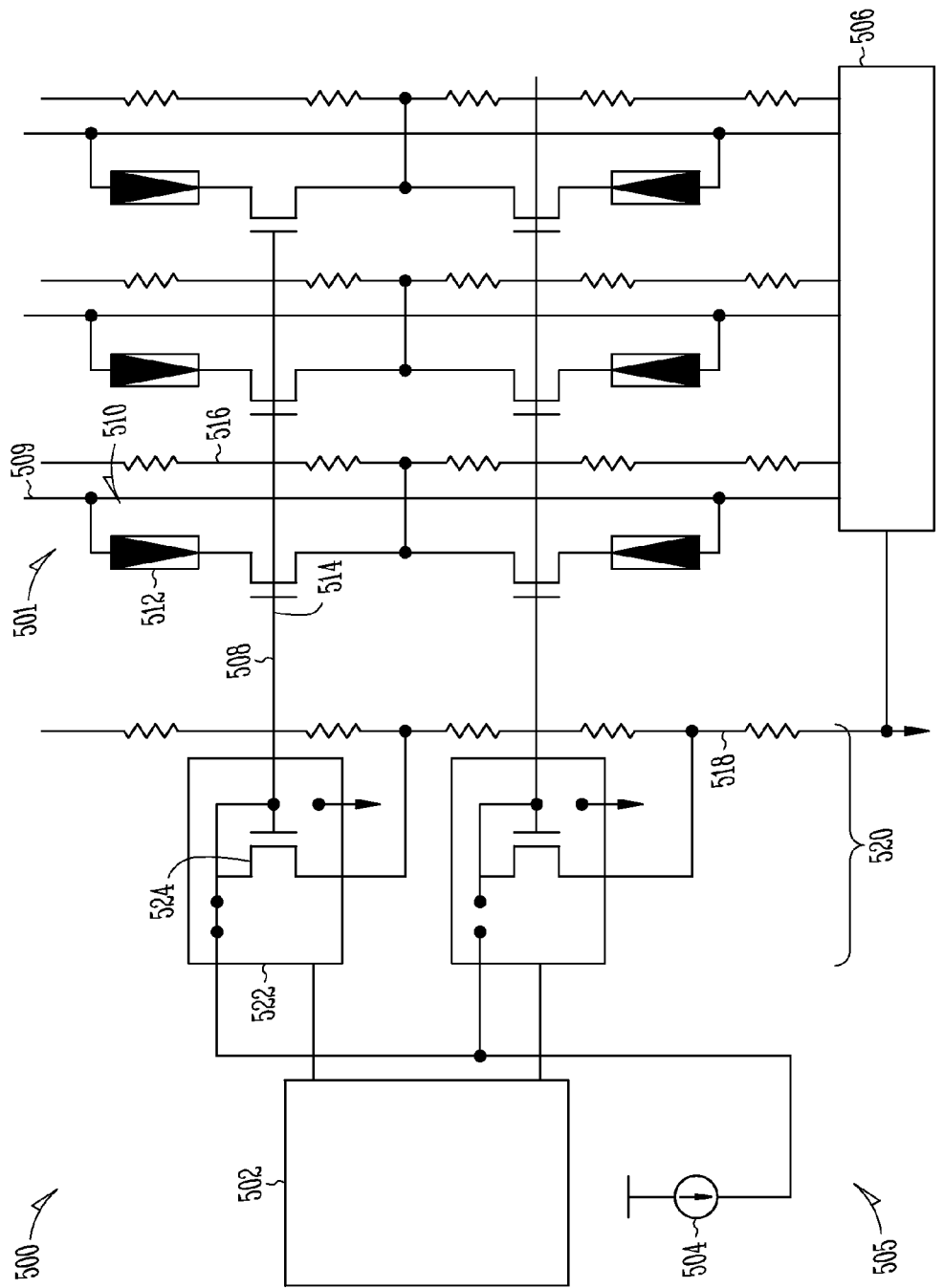
FIG. 5 shows another circuit diagram of a memory device according to an embodiment of the invention.

FIG. 5 shows an example circuit diagram of an apparatus 500 including a variable state material according to an embodiment of the invention. In FIG. 5, parasitic resistance in the circuit is illustrated by a number of resistors 503. A row decoder 502 is shown coupled to an array of memory cells 501. Cells 510 within the array of memory cells 501 include a variable state material component 512 coupled between a corresponding source line 509 and a corresponding data line 516. A current compliance circuit 505 is included in the apparatus 500 to control current during a memory operation. In one example, a memory "set" operation utilizes the current compliance circuit 505 to substantially reduce, and ideally prevent, joule heating in the region 320, as shown in FIG. 3.

In one example, the current compliance circuit 505 includes a reference current circuit 520 and a current limiter 504. In the example of FIG. 5, the reference current circuit 520 includes a column of row drivers 522, such as those comprising reference diodes 524. In one example, the reference diodes 524 are formed using the same materials, at the same dimensions (e.g., on pitch with), and in the same process steps as the access devices 514 of the array 501, such as to match the access devices 514 in such a way as to make a good current mirror. However, at least in an embodiment where the access devices 514 are access transistors, unlike an access transistor, a reference diode 524 is formed with its gate coupled to its source. In one example, the reference diode 524 is a transistor with a source coupled to a gate, as shown in FIG. 5.

In one example, the reference current circuit 520 also includes a reference line 518. The reference line 518 is, in at least one example, formed using the same material (e.g., the same metal layer), at the same dimensions, and in the same process steps as a data line 516 of the array 501. For example, the reference line 518 might have the same cross sectional height and width as a data line 516.

The reference diodes 524 and the reference line 518 may be structurally and operationally similar to components within the array 501, such as access transistors 514 and data lines 516, such that they can be used to form a current mirror. For example, with respect to a given access line 508, a reference diode 524 (coupled to that access line 508) and a reference line 518 can be configured such that a portion of the reference line 518 coupled between the reference diode 524 and a column driver circuit 506 has substantially the same resistance as a portion of a data line 516 coupled between an access device 514 (coupled to that access line 508) and the column driver circuit 506.

For example, during operation, the current limiter 504 generates a signal to access line 508. The signal from the current limiter 504 sets an upper limit for a bias condition on gates of access transistors 514 in the array, as well as on the reference diode 524. A current measured in the reference line 518 in configurations described herein, will mirror a current within a selected data line 516 in the array 501. In one example, the current limiter 504 uses the mirror current from the reference current circuit 520 to set an upper limit on a bias condition on gates of access transistors 514 in the array.

In one example operation, the reference current circuit 520 is used to set an upper limit for a bias condition on gates of access transistors 514 in the array during a "set" operation. In another example operation, the reference current circuit 520 is used to set an upper limit for a bias condition on gates of access transistors 514 in the array during a "reset" operation. Other memory operations may also utilize the reference current circuit 520.

When different access lines in the array 501 are selected, an operative length of the data line 516 (i.e., the length of the data line that the current travels through) becomes longer or shorter depending on the location of the selected access line. In the example of FIG. 5, an operative length of the reference line 518 that the current travels through also becomes longer or shorter. In some embodiments, the resulting operative length of the data line 516 that the current passes through substantially matches the operative length of the reference line 518 that the reference current passes through. Using components that match those within the array 501 as described may provide for good current matching of the cell current to the reference current.

Figure 6:
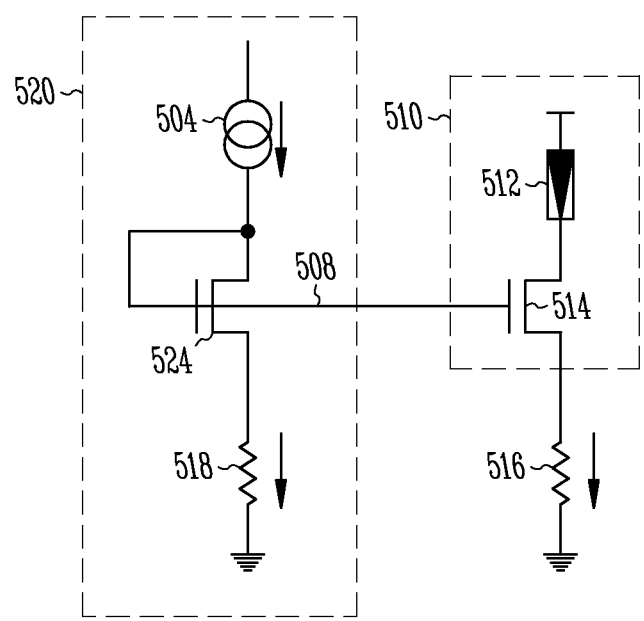
FIG. 6 shows another circuit diagram of a memory device according to an embodiment of the invention.

FIG. 6 illustrates this concept in a simplified circuit diagram. The reference current circuit 520 from FIG. 5 is shown with the current limiter 504 coupled to the reference diode 524. The reference line 518 is shown alongside the data line 516. The access transistor 514 has substantially the same dimensions as the reference diode 524. In one example the access transistor 514 is formed from the same materials, in the same manufacturing operation as the reference diode 524. Because the current limiter 504 is using accurate feedback information from the reference line 518 and the reference diode 524, that mirrors conditions in the data line 516 and access transistor 514, the current limiter 504 sets an accurate upper limit current on the access line 508. As a result, the variable state material 512 of the memory cell 510 is protected from damage such as joule heating by setting an upper limit condition of the access transistor 514 using a signal along the access line 508.

Figure 7:
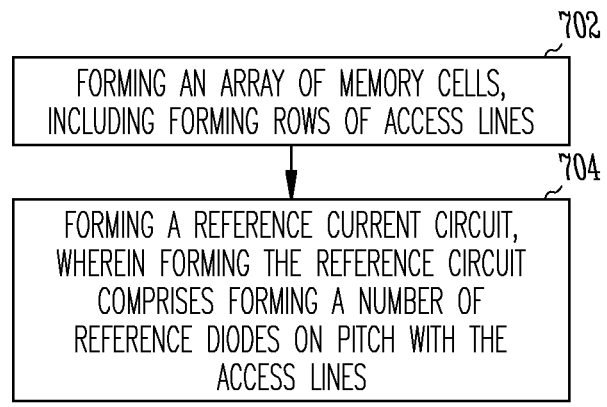
FIG. 7 shows an example method according to an embodiment of the invention.

FIG. 7 shows an example method according to an embodiment of the invention. In operation 702 access lines are formed. In operation 704, a reference current circuit is formed in the same process steps and at the same dimensions, and using the same materials (e.g., layers of materials) as those used to form access transistors and data lines of the array of memory cells. In one embodiment, a number of reference diodes are formed on pitch with the access lines.

Figure 8:
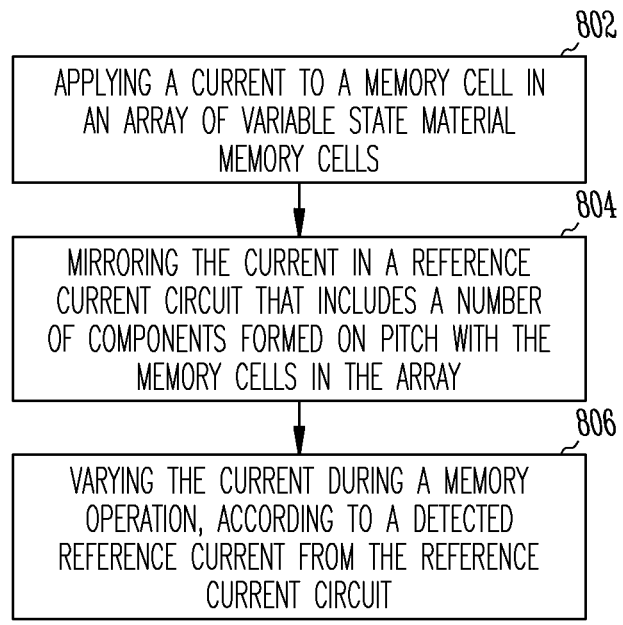
FIG. 8 shows another example method according to an embodiment of the invention.

FIG. 8 shows another example method according to an embodiment of the invention. In operation 802, a current is applied to a memory cell in an array of variable state material memory cells. In operation 804, the current is mirrored in a reference current circuit that includes a number of components formed on pitch with the memory cells in the array. In operation 806, the current is varied during a memory operation, according to a detected reference current from the reference current circuit.

Figure 9:
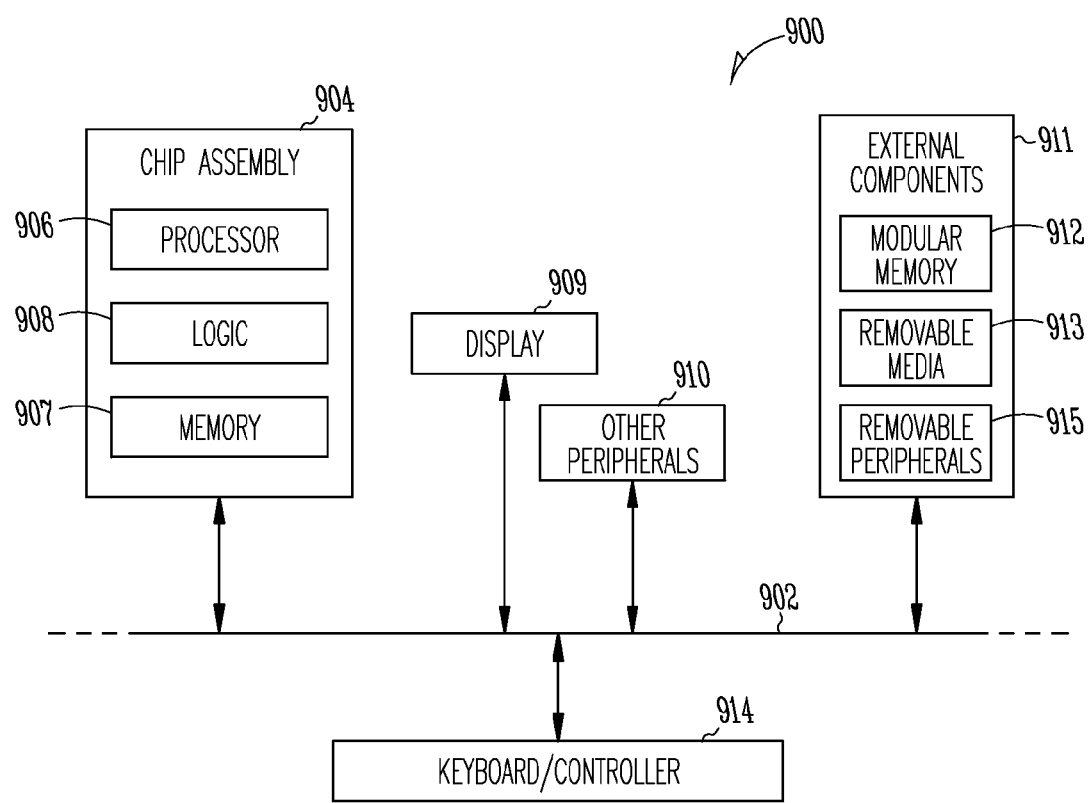
FIG. 9 shows an information handling system, including a memory device, according to an embodiment of the invention.

For example, FIG. 9 is a block diagram of an apparatus in the form of an information handling system 900 incorporating at least one chip or chip assembly 904 that includes a memory device 907 (e.g., a device similar to or identical to the apparatus 400 shown in FIG. 4 and/or the apparatus 600 shown in FIG. 6) according to an embodiment of the invention. The assembly 904 may also include a processor 906 and other logic 908.

In one example, the memory device 907 includes a variable state material memory device such as an RRAM. The information handling system 900 shown in FIG. 9 is merely one example of an apparatus in which the present invention can be used. Other examples include, but are not limited to, personal data assistants (PDAs), tablet computers, cameras, cellular telephones, MP3 players, aircraft, satellites, military vehicles, etc.

In this example, information handling system 900 comprises a data processing system that includes a system bus 902 to couple the various components of the system. System bus 902 provides communications links among the various components of the information handling system 900 and may be implemented as a single bus, as a combination of busses, or in any other suitable manner.

Chip assembly 904 is coupled to the system bus 902. Chip assembly 904 may include any circuit or operably compatible combination of circuits. In one embodiment, chip assembly 904 includes a processor 906 that can be of any type. As used herein, "processor" means any type of computational circuit such as, but not limited to, a microprocessor, a microcontroller, a graphics processor, a digital signal processor (DSP), or any other type of processor or processing circuit. Multiple processors such as "multi-core" devices are also within the scope of the invention.

In one embodiment, a memory device 907, such as a memory device described in embodiments above, is included in the chip assembly 904. Those skilled in the art will recognize that a wide variety of memory device configurations may be used in the chip assembly 904. As discussed above, in selected embodiments, the memory configuration includes RRAM. In selected embodiments the memory cells are arranged in different logical configurations, such as NAND memory or NOR memory. In one example, the memory configuration is a dynamic random access memory (DRAM) configuration.

In one embodiment, additional logic chips 908 other than processor chips are included in the chip assembly 904. An example of a logic chip 908 other than a processor includes an analog to digital converter. Other circuits on logic chips 908 such as custom circuits, an application-specific integrated circuit (ASIC), etc. are also included in one embodiment of the invention.

Information handling system 900 may also include an external memory 911, which in turn can include one or more memory elements suitable to the particular application, such as one or more hard drives 912, and/or one or more drives that handle removable media 913 such as flash drives, compact disks (CDs), digital video disks (DVDs), and the like.

Information handling system 900 may also include a display device 909 such as a monitor, additional peripheral components 910, such as speakers, etc. and a keyboard and/or controller 914, which can include a mouse, a touchscreen interface, or any other device that permits a system user to input information into and receive information from the information handling system 900.

While a number of embodiments of the invention are described, the above lists are not intended to be exhaustive. Although specific embodiments have been illustrated and described herein, it will be appreciated by those of ordinary skill in the art that any arrangement that is calculated to achieve the same purpose may be substituted for the specific embodiment shown. This application is intended to cover any adaptations or variations of the present invention. It is to be understood that the above description is intended to be illustrative and not restrictive. Combinations of the above embodiments, and other embodiments, will be apparent to those of skill in the art upon studying the above description.

What is claimed is:

1. A memory device, comprising:
  an array of memory cells having access lines and data lines, at least some of the cells including:
    a variable state material component;
    an access device coupled to the variable state material component and a corresponding one of the access lines;
    a reference circuit, wherein the reference circuit includes a number of components formed on pitch with the access devices in the array of memory cells to provide a reference current that mirrors a data line current, wherein an operative length of a reference line in the reference circuit matches an operative length of a corresponding data line;
    a current limiter coupled to the reference circuit, wherein the current limiter is configured to set an upper limit on a bias condition on the access device; and
    a driver coupled to the array of memory cells to concurrently provide a set voltage and a reset voltage to different memory cells in the array at the same time.

2. The memory device of claim 1, wherein the driver is further configured to provide an inhibit voltage to selected cells in the array at the same time as the set voltage and the reset voltage are being applied to different memory cells in the array.

3. The memory device of claim 1, wherein the number of components of the reference current circuit includes a number of reference diodes, wherein each of the number of reference diodes is coupled to a respective one of the access lines.

4. The memory device of claim 1, wherein the reference current circuit is configured such that an operative length of the reference line remains substantially the same as an operative length of a selected one of the data lines.

5. The memory device of claim 1, wherein the variable state material comprises resistance switching material.

6. A memory device, comprising:
  an array of memory cells having access lines and data lines, at least some of the cells including:
    a variable state material component;
    an access device coupled to the variable state material component and a corresponding one of the access lines;
    a reference circuit, wherein the reference circuit includes a number of components formed on pitch with the access devices in the array of memory cells to provide a reference current that mirrors a data line current, wherein an operative length of a reference line in the reference circuit matches an operative length of a corresponding data line;
    a current limiter coupled to the reference circuit, wherein the current limiter is configured to set an upper limit on a bias condition on the access device; and
    a plurality of voltage input nodes, including a reset voltage input node and a set voltage input node, with selector circuitry to selectively couple the reset voltage input node and the set voltage input node to different memory cells in an array of memory cells at the same time.

7. The memory device of claim 6, wherein the plurality of voltage input nodes further includes an inhibit voltage input node.

8. The memory device of claim 7, further including a number of selector circuits with each selector circuit providing a selected voltage from the plurality of voltage input nodes to a data line.

9. The memory device of claim 8, wherein each selector circuit includes three switches, each switch corresponding to the reset voltage input node, the set voltage input node, and the inhibit voltage input node.

10. The memory device of claim 6, wherein the wherein the number of components of the reference current circuit includes a number of reference diodes, wherein each of the number of reference diodes is coupled to a respective one of the access lines.

11. The memory device of claim 6, wherein the reference current circuit is configured such that an operative length of the reference line remains substantially the same as an operative length of a selected one of the data lines.

12. The memory device of claim 6, wherein the variable state material comprises resistance switching material.

13. An information handling system, comprising:
  a processor;
  an array of memory cells coupled to the processor, having access lines and data lines, at least some of the cells including:
    a variable state material component;
    an access device coupled to the variable state material component and a corresponding one of the access lines;
  a reference circuit, wherein the reference circuit includes a number of components formed on pitch with the access devices in the array of memory cells to provide a reference current that mirrors a data line current, wherein an operative length of a reference line in the reference circuit matches an operative length of a corresponding data line;
  a current limiter coupled to the reference circuit, wherein the current limiter is configured to set an upper limit on a bias condition on the access device; and
  a driver coupled to the array of memory cells to provide set and reset voltages to different memory cells in the array at the same time.

14. The information handling system of claim 13, wherein the processor and array of memory cells are included in a tablet computer.

15. The information handling system of claim 13, wherein the processor and array of memory cells are included in a cellular telephone.

16. The information handling system of claim 13, further including a touchscreen user interface coupled to the processor.

17. The information handling system of claim 13, wherein the driver is further configured to provide an inhibit voltage to selected cells in the array at the same time as the set voltage and the reset voltage are being applied to different memory cells in the array.

18. The information handling system of claim 13, further including a number of selector circuits with each selector configured to provide a different selected voltage from the driver to a data line associated with the selector circuit.

* * * * *